United States Patent
Tanioka et al.

(10) Patent No.: US 8,753,951 B2
(45) Date of Patent: Jun. 17, 2014

(54) METHOD FOR MANUFACTURING SILICON CARBIDE SEMICONDUCTOR DEVICE

(75) Inventors: Toshikazu Tanioka, Tokyo (JP); Masayuki Furuhashi, Tokyo (JP); Masayuki Imaizumi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 201 days.

(21) Appl. No.: 13/256,080

(22) PCT Filed: Mar. 10, 2010

(86) PCT No.: PCT/JP2010/001690
§ 371 (c)(1),
(2), (4) Date: Sep. 12, 2011

(87) PCT Pub. No.: WO2010/103820
PCT Pub. Date: Sep. 16, 2010

(65) Prior Publication Data
US 2012/0009801 A1     Jan. 12, 2012

(30) Foreign Application Priority Data
Mar. 11, 2009   (JP) ................................. 2009-057951

(51) Int. Cl.
*H01L 21/20*   (2006.01)

(52) U.S. Cl.
USPC ......................................................... 438/396

(58) Field of Classification Search
None
See application file for complete search history.

(56) References Cited

U.S. PATENT DOCUMENTS

2003/0119273 A1 *   6/2003   Aggarwal et al. ............. 438/396
2010/0320437 A1 *  12/2010   Gordon et al. ................... 257/9

FOREIGN PATENT DOCUMENTS

| JP | 2004 31864 | | 1/2004 |
| JP | 2005 109396 | | 4/2005 |
| JP | 2005-109396 A | * | 4/2005 |
| JP | 2005 136386 | | 5/2005 |
| JP | 2006 156478 | | 6/2006 |
| JP | 2006 210818 | | 8/2006 |

OTHER PUBLICATIONS

International Search Report Issued Jun. 22, 2010 in PCT/JP10/001690 filed Mar. 10, 2010.
Japanese Office Action issued on Feb. 12, 2014 in Patent Application No. 2011-200858 with English translation.

* cited by examiner

*Primary Examiner* — Charles Garber
*Assistant Examiner* — Andre' C Stevenson
(74) *Attorney, Agent, or Firm* — Oblon, Spivak, McClelland, Maier & Neustadt, L.L.P.

(57) ABSTRACT

In a silicon carbide MOSFET, interface state generated at an interface between a silicon carbide layer and a gate insulating film cannot be reduced sufficiently, and mobility of a carrier is decreased. To solve this problem, a silicon carbide semiconductor device according to this invention includes a substrate introduction step of introducing a substrate, which includes a silicon carbide layer on which a gate insulating film is formed, in a furnace, such that the substrate is arranged in a predetermined position of the furnace, and a heating step of heating the furnace having the substrate introduced therein while introducing nitrogen monoxide and nitrogen therein, wherein, in the heating step, nitrogen is reacted to nitride an interface between the gate insulating film and the silicon carbide layer.

18 Claims, 9 Drawing Sheets

METHOD FOR MANUFACTURING SILICON CARBIDE SEMICONDUCTOR DEVICE

TECHNICAL FIELD

This invention relates to a method for manufacturing a silicon carbide vertical field effect transistor which is a silicon carbide semiconductor device, and more particularly to a method for manufacturing a silicon carbide vertical field effect transistor for large electric power, having decreased on-resistance.

BACKGROUND ART

Silicon carbide has excellent physical values. Therefore, by utilizing its characteristic, it is expected to apply the silicon carbide to a power device having high pressure resistance and low loss.

In the case of applying silicon carbide to a silicon carbide vertical metal-oxide film-semiconductor field effect transistor (Metal Oxide Semiconductor Field Effect Transistor: MOSFET) which is one kind of a silicon carbide semiconductor device, a gate insulating film such as a silicon dioxide layer is formed on the silicon carbide.

In the case of forming the silicon dioxide film on the silicon carbide, a method of thermally oxidizing silicon carbide and a method of depositing the silicon dioxide film on the silicon carbide are used. When any of those methods is used, an interface state is formed at the interface between the silicon carbide and the silicon dioxide film. In some cases, the interface state decreases field effect mobility of MOSFET than mobility in a silicon carbide bulk, and increases resistance value of MOSFET in an on-operation state, thereby increasing loss.

To deactivate such an interface state formed in the interface between silicon carbide and the silicon dioxide film, some methods of forming a silicon dioxide film on silicon carbide and then subjecting the film to high temperature treatment in nitrogen monoxide (NO) gas or dinitrogen monoxide ($N_2O$) gas are known.

For example, a method of high temperature treatment in a nitrogen monoxide gas diluted with an inert gas, a method of decreasing a concentration of an oxygen gas generated, and a method of reducing interface defect between a silicon carbide semiconductor substrate and an insulting film are conventionally known (for example, Patent Document 1).

Further, it is known that an interface state density is decreased by heat-treating in a nitrogen monoxide gas under reduced pressure (for example, Patent Document 2).

Further, it is conventionally known that the interface state density is decreased by controlling a partial pressure of a nitrogen monoxide gas by mixing a nitrogen monoxide gas and an inert gas, the inert gas may be He, Ar or $N_2$, and by controlling a volume of a chamber and a flow rate (for example, Patent Document 3).

PRIOR ART REFERENCE

Patent Document

Patent Document 1: JP-A 2005-109396 (pages 3-8)
Patent Document 2: JP-A2005-136386 (page 11)
Patent Document 3: JP-A 2006-210818 (Pages 6 to 7)

SUMMARY OF INVENTION

Problems that the Invention is to Solve

Patent Documents 1 to 3 describe that it is better to promote nitriding with a nitrogen monoxide gas, it is better to inhibit the effect of oxygen by an oxygen gas formed by a decomposition reaction of a nitrogen monoxide gas, and a nitrogen monoxide gas is diluted with an inter gas to decrease the concentration of the nitrogen monoxide gas. However, a method of promoting nitriding other than a nitridation reaction with nitrogen generated from a nitrogen monoxide gas has not been known. For this reason, generation of an oxygen gas causing oxidation cannot be inhibited sufficiently, and in some cases, the interface state of silicon carbide/gate insulating film, which is nitrided by the methods of the prior art technologies of Patent Documents 1 to 3, could not sufficiently be reduced.

Patent Document 3 shows a method of diluting a nitrogen monoxide gas with a nitrogen gas. However, the nitrogen gas is used as an inert gas and a nitriding temperature is not sufficiently high. Therefore, there is no description in Patent Document 3 that nitrogen from the nitrogen gas is utilized in the nitriding by contributing the nitrogen gas to a reaction.

This invention has been made to solve the above problems, and the object thereof is to obtain a silicon carbide semiconductor device having further decreased interface state of silicon carbide/gate insulating film, and having a carrier of high mobility.

Means for Solving the Problems

A method for manufacturing a silicon carbide semiconductor device according to this invention includes: a substrate introduction step of introducing a substrate, which includes a silicon carbide layer and a gate insulating film on and in contact with the silicon carbide layer, in a furnace, such that the substrate is arranged in a predetermined position of the furnace; and a heating step of heating the furnace having the substrate introduced therein while introducing nitrogen monoxide and nitrogen therein, wherein, in the heating step, the nitrogen is reacted to nitride an interface between the gate insulating film and the silicon carbide layer.

Advantage of the Invention

According to this invention, a silicon carbide field effect semiconductor device having sufficiently decreased interface state in the interface between a silicon carbide layer and a gate insulating film and having a carrier of high mobility of can be obtained.

MODE FOR CARRYING OUT THE INVENTION

Embodiment 1

Figure 1:
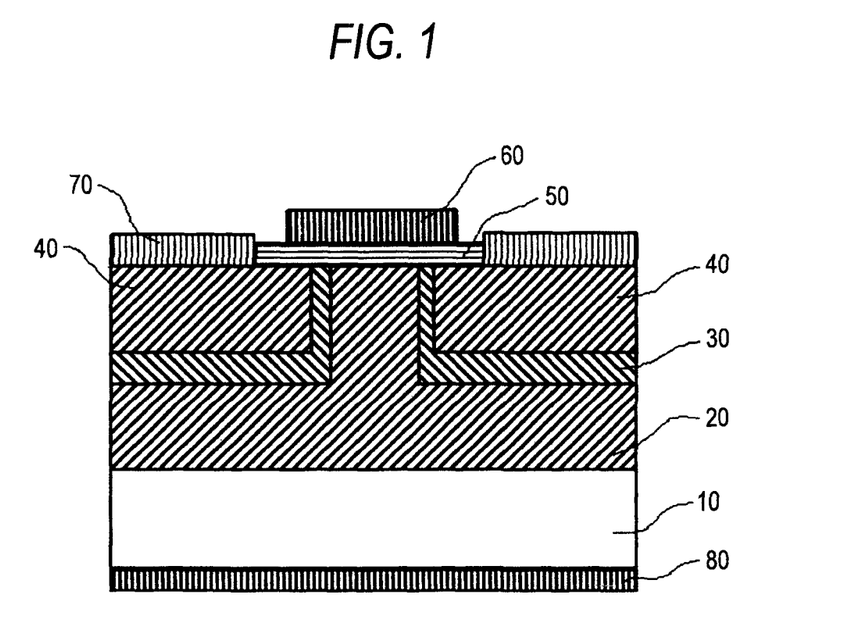
FIG. 1 is a cross-sectional schematic view of a silicon carbide semiconductor device in an embodiment 1 of this invention.

A cross-sectional schematic view of an element structure of a silicon carbide semiconductor device produced by a method for manufacturing a silicon carbide semiconductor device of an embodiment 1 of the present invention is shown in FIG. 1. A cross-sectional structure of n-channel silicon carbide MOSFET is shown as one example of the-silicon carbide semiconductor device. In the present embodiment, a first conductive type is described as n-type, and a second conductive type is described as p-type.

In FIG. 1, an n-type silicon carbide drift layer 20 is formed on a first principal surface of an n-type low resistance silicon carbide substrate 10. A p-type base region 30 containing aluminum (Al), which is a first impurity, as a p-type impurity is formed on a site separated with a certain width at a surface side of the silicon carbide drift layer 20. Furthermore, an n-type source region 40 containing nitrogen (N), which is a second impurity, as an n-type impurity is formed on a surface part inside in the respective cross-sectional directions of the base region 30 with a depth smaller than the base region 30.

A gate insulating film 50 configured of silicon dioxide is formed on a surface side of the silicon carbide drift layer 20 containing the base region 30 and the source region 40, except for a part of the surface side of the source region 40. Furthermore, a gate electrode 60 is formed on the gate insulating film 50 at a position facing a site containing a region between a pair of the source regions 40. Additionally, a source electrode 70 is formed on a surface of the source region 40 on which the gate insulating film 50 is not formed, and a drain electrode 80 is formed on a second principal surface, that is, a rear surface, opposite a first principal surface of the silicon carbide substrate 10.

In FIG. 1, a region of the base region 30, which faces the gate electrode 60 through the gate insulating film 50 and on which an inversion layer is formed in an on-operation state, is called a channel region. Furthermore, a distance sandwiching the channel region between the source region 40 and a region free of ion injection on the surface part of the silicon carbide drift layer 20 is called a channel length.

A method for manufacturing an n-channel MOSFET which is the silicon carbide semiconductor device of the embodiment 1 is sequentially described hereinafter using FIGS. 2 to 9. FIGS. 2 to 5, FIG. 8 and FIG. 9 are cross-sectional schematic views in each production step of an n-channel MOSFET.

Figure 2:
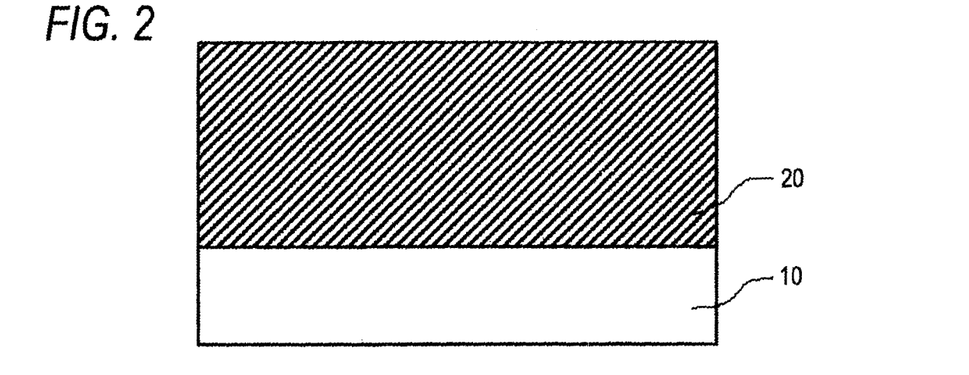
FIG. 2 is a cross-sectional schematic view showing one step of a method for manufacturing a silicon carbide semiconductor device in the embodiment 1 of this invention.

The silicon carbide drift layer 20 having an n-type impurity concentration of from $1 \times 10^{15}$ cm$^{-3}$ to $1 \times 10^{18}$ cm$^{-3}$ and a thickness of from 5 to 50 μm is epitaxially grown on the surface of the n-type low resistance silicon carbide substrate 10 having 4H poly type, a plane direction of a first principal surface being (0001) plane, by a chemical vapor deposition (CVD) method as shown in FIG. 2. When the silicon carbide drift layer 20 is formed under those conditions, a high pressure-resistant MOSFET having pressure resistance of from several hundreds V to 3 kV or larger can be realized.

Figure 3:
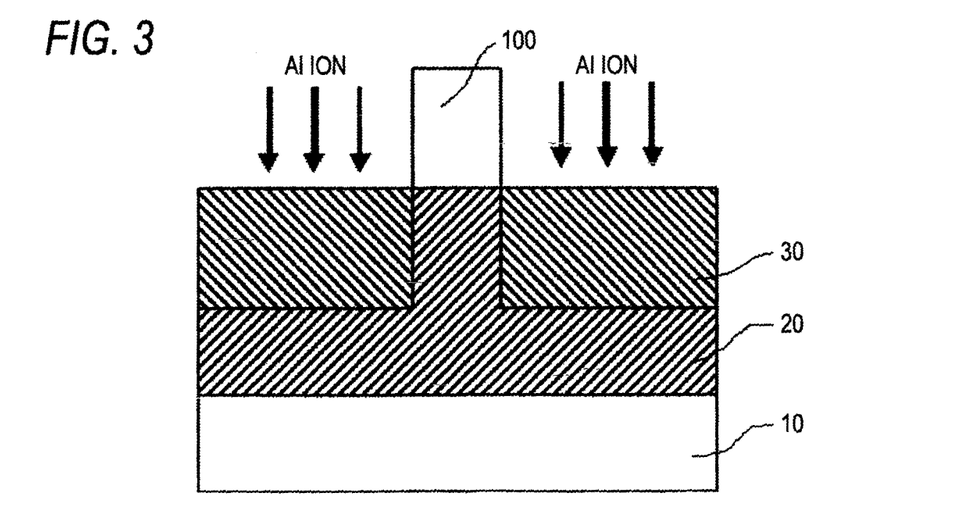
FIG. 3 is a cross-sectional schematic view showing one step of a method for manufacturing a silicon carbide semiconductor device in the embodiment 1 of this invention.

As shown in FIG. 3, a first injection mask 100 is formed on the surface of the silicon carbide drift layer 20, and Al, which is a p-type first impurity, is ion-injected in the silicon carbide drift layer 20 having the first injection mask 100 formed on the surface thereof. In this case, the depth of the ion injection of Al is from about 0.5 to 3 μm which does not exceed the thickness of the silicon carbide drift layer 20. Furthermore, the impurity concentration of Al ion-injected is a range of from $1 \times 10^{17}$ cm$^{-3}$ to $1 \times 10^{19}$ cm$^{-3}$ and is larger than the n-type impurity concentration of the silicon carbide drift layer 20. A region becoming a p-type, among the region of the silicon carbide drift layer 20 in which Al has been ion-injected, constitutes the base region 30.

Figure 4:
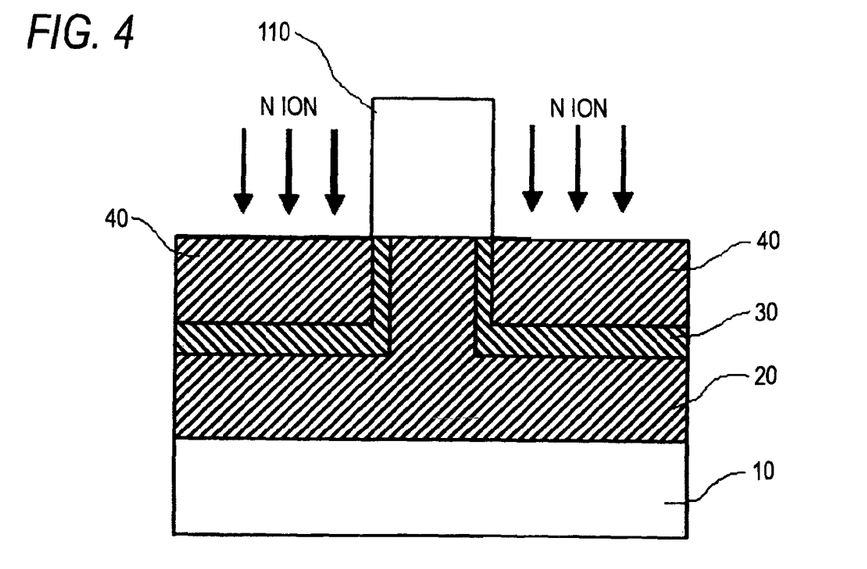
FIG. 4 is a cross-sectional schematic view showing one step of a method for manufacturing a silicon carbide semiconductor device in the embodiment 1 of this invention.

After removing the first injection mask 100, a second injection mask 110 is formed on the surface of the silicon carbide drift layer 20 in a width-larger than the first injection mask 100 as shown in FIG. 4. N which is an n-type second impurity is ion-injected in the surface of the silicon carbide drift layer 20 having the second injection mask 110 formed thereon. An ion injection depth of N is smaller than the thickness of the base region 30. Impurity concentration of N, which is ion-injected, is a range of from $1 \times 10^{18}$ cm$^{-3}$ to $1 \times 10^{21}$ cm$^{-3}$ and exceeds the p-type impurity concentration of the base region 30. Of the region in which N in the silicon carbide drift layer 20 has been injected, a region showing an n-type constitutes the source region 40. After removing the second injection mask 110, annealing is conducted at from 1,300 to 1,900 degrees C. for from 30 seconds to 1 hour in an inert gas atmosphere such as argon (Ar) gas by a heat treatment apparatus. N and Al ion-injected are electrically activated by the annealing.

Figure 5:
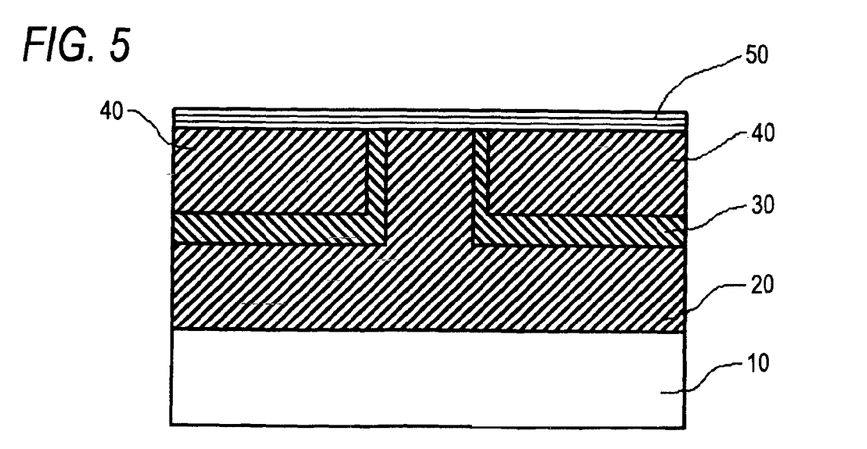
FIG. 5 is a cross-sectional schematic view showing one step of a method for manufacturing a silicon carbide semiconductor device in the embodiment 1 of this invention.

Subsequently, as shown in FIG. 5, the surface of the silicon carbide drift layer 20 containing the source region 40 and the base region 30 is heat-oxidized to form a gate insulating film 50 of silicon carbide having a desired thickness of 100 nm or smaller.

Figure 6:
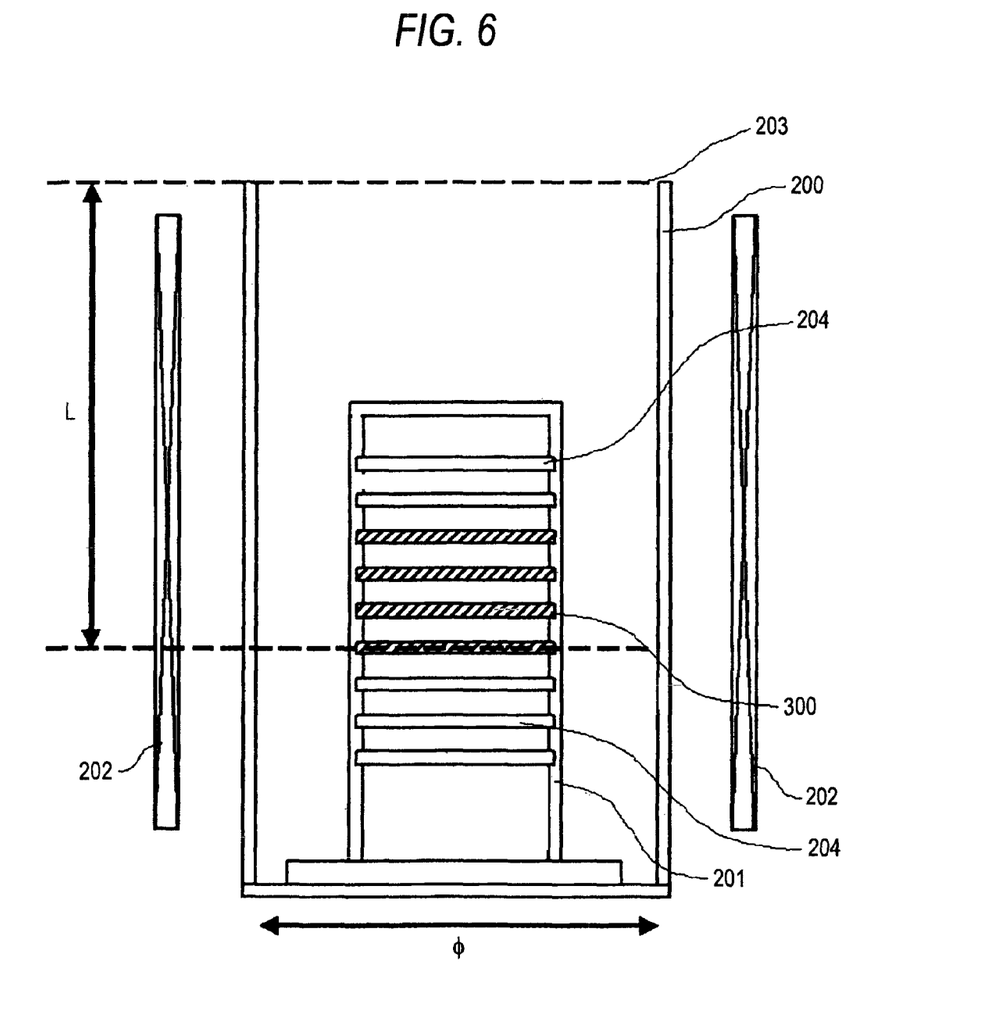
FIG. 6 is a schematic view showing a nitridation step in a method for manufacturing a silicon carbide semiconductor device in the embodiment 1 of this invention.
Figure 7:
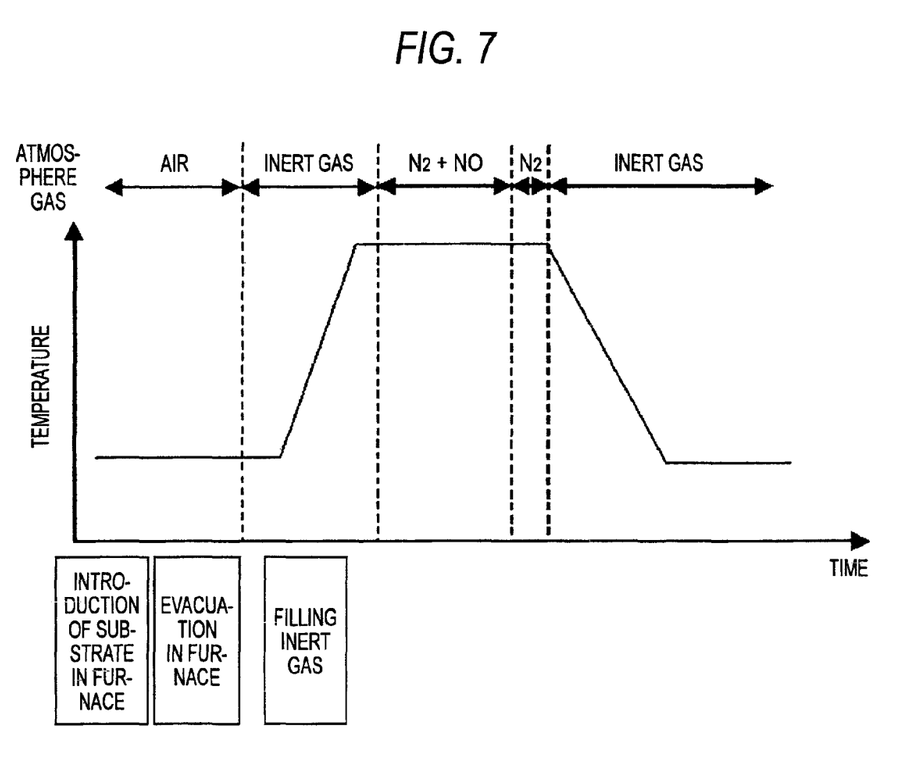
FIG. 7 is a sequence view showing a treatment summary of a nitridation step in a method for manufacturing a silicon carbide semiconductor device in the embodiment 1 of this invention.

Nitriding treatment is conducted in the sequence shown in FIG. 7 using a furnace shown in FIG. 6.

First, the furnace of FIG. 6 is described.

FIG. 6 is a cross-sectional schematic view of a reaction furnace that the nitriding treatment, which is one step in the method for manufacturing a silicon carbide semiconductor device in the embodiment 1 of the present invention. In FIG. 6, a boat 201 on which a substrate 300 having a diameter of 100 mm is placed is provided in a furnace 200 having a circular cross-section and an inner diameter of 140 mm. A heater 202 is provided around the furnace 200 so as to surround the furnace. A substrate 300 is arranged at an upstream side than the position separated in a length L from a gas inlet 203 of the furnace 200 in a direction of gas flow. Some dummy substrates 204 are arranged at an upstream side and a downstream side of the substrate 300.

Next, the sequence of the nitriding treatment is described using FIG. 7.

The substrate 300 treated until the step shown in FIG. 5 is introduced in the furnace 200, and as shown in FIG. 7, the inside of the furnace 200 is evacuated up to 1.3 Pa or smaller, thereby removing an oxidizing gas in the furnace 200. Next, an inert gas such as Ar is introduced in the furnace 200 until the pressure in the furnace 200 reaches the atmospheric pressure. Next, the furnace 200 is heated while the inert gas is flown in the furnace 200. At the state that the furnace 200 reaches the temperature for nitriding treatment and the inside of the furnace 200 becomes a constant temperature, the gas introduced in the furnace 200 is switched from the inert gas to a mixed gas of a nitrogen gas and a nitrogen monoxide gas. At the time a predetermined time has passed and the nitriding treatment has completed, the mixed gas of the nitrogen gas and the nitrogen monoxide gas is switched to a nitrogen gas, and is left for a certain period of time. Next, after switching the nitrogen gas to an inert gas such as Ar, output of the heater 202 of the furnace 200 is decreased to decrease the temperature. At the stage that the temperature of the substrate 300 becomes nearly ordinary temperature, the substrate 300 is taken out of the furnace 200. The reason why the mixed gas is switched to the nitrogen gas just after completion of the nitriding treatment is to inhibit decomposition of residual nitrogen monoxide.

Here, the nitriding treatment temperature is, for example, 1,250 degrees C., and a mixing ratio of the nitrogen gas and the nitrogen monoxide gas is, for example, 1:1. Furthermore, the distance L of from the gas inlet 203 of the furnace 200 to the substrate 300 is 200 mm or smaller.

Figure 8:
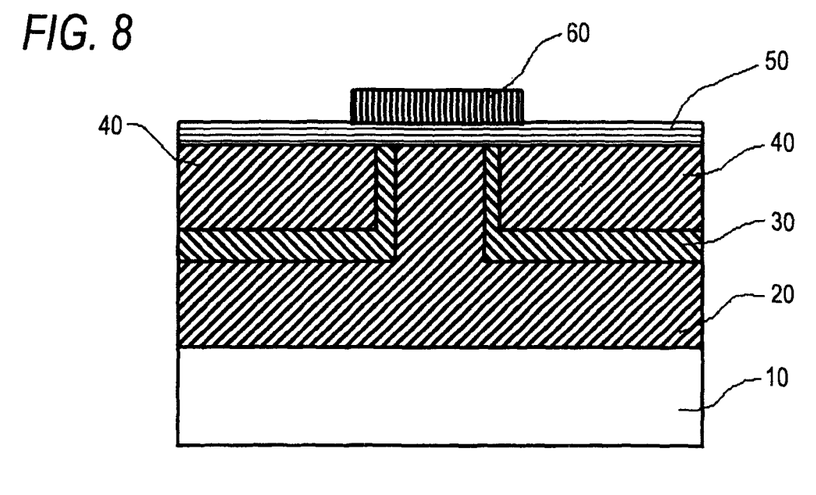
FIG. 8 is a cross-sectional schematic view showing one step of a method for manufacturing a silicon carbide semiconductor device in the embodiment 1 of this invention.

As shown in FIG. 8, a polycrystal silicon film having conductivity is formed on the gate insulating film 50 by a reduced pressure CVD method, and the film is subjected to patterning to form the gate electrode 60. In this case, it is desired that the gate electrode overlaps a pair of source regions 4 in a range of, for example, from 10 nm to 5 μm.

Figure 9:
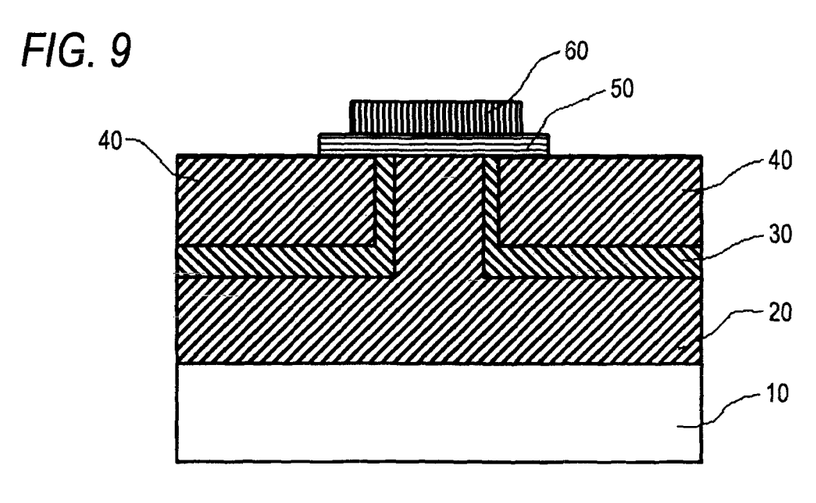
FIG. 9 is a relationship view showing one step of a method for manufacturing a silicon carbide semiconductor device in the embodiment 1 of this invention.

Thereafter, the gate insulating film 50 is opened as shown in FIG. 9. Finally, a source electrode 70 electrically connected to the source region 40 is formed, and a drain electrode 80 is formed on the rear side of the silicon carbide substrate 10. Thereby, an n-channel MOSFET shown in FIG. 1 is completed. The material for the source electrode 70 and the drain electrode 80 is, for example, an Al alloy.

The silicon carbide MOSFET thus produced, which is one kind of a silicon carbide semiconductor device, can sufficiently reduce the interface state between the silicon carbide layer and the gate insulating film, and shows high mobility value.

The nitriding treatment of the gate insulating film 50 described using FIGS. 6 and 7 will be described in detail.

When the mixed gas of the nitrogen gas and the nitrogen monoxide gas is heated, the reaction shown in Table 1 occurs, as described in R. J. Wu and C. T. Yeh, Int. J. Chem. Kinet. 28, 89 (1996).

TABLE 1

| No. | Reaction Equation | E (kJmol$^{-1}$) | A (cm$^3$ mol$^{-1}$ s$^{-1}$) |
|---|---|---|---|
| (a) | NO + NO $\underset{k_{-a}}{\overset{k_a}{\rightleftarrows}}$ N$_2$O + O | $E_a = 272$<br>$E_{-a} = 112$ | $A_a = 7.0 \times 10^{11}$<br>$A_{-a} = 2.5 \times 10^{13}$ |
| (b) | O + NO $\underset{k_{-b}}{\overset{k_b}{\rightleftarrows}}$ O$_2$ + N | $E_b = 161$<br>$E_{-b} = 26$ | $A_b = 1.5 \times 10^9 \times T$<br>$A_{-b} = 6.4 \times 10^9 \times T$ |
| (c) | N + NO $\underset{k_{-c}}{\overset{k_c}{\rightleftarrows}}$ N$_2$ + O | $E_c = 1.4$<br>$E_{-c} = 316$ | $A_c = 3.1 \times 10^{13}$<br>$A_{-c} = 1.4 \times 10^{14}$ |
| (d) | O + O + M $\underset{k_{-d}}{\overset{k_d}{\rightleftarrows}}$ O$_2$ + M | $E_d = 14$<br>$E_{-d} = 493$ | $A_d = 1.5 \times 10^{15} \times T_{(cm^6 mol^{-2} s^{-1})}^{0.8}$<br>$A_{-d} = 1.4 \times 10^{21} \times T^{-1.8}$ |
| (e) | NO + O$_2$ $\underset{k_{-e}}{\overset{k_e}{\rightleftarrows}}$ NO$_2$ + O | $E_e = 198$<br>$E_{-e} = 2.5$ | $A_e = 3.0 \times 10^{12}$<br>$A_{-e} = 1.0 \times 10^{13}$ |
| (f) | N$_2$O + O $\overset{k_f}{\longrightarrow}$ N$_2$ + O | $E_f = 117$ | $A_f = 1.0 \times 10^{15}$ |

E means activation energy, A means a coefficient, and M means a molecule that can move energy in the formula (d).

The amount of nitrogen monoxide decomposed and the amount of oxygen generated in the case that a nitrogen gas and a nitrogen monoxide gas are heated are calculated using six formulae in Table 1. Specifically, the amount of each element after t hours is calculated using each reaction rate shown by the formulae (1) to (11) in Table 2 and the calculation formulae (12) to (20) in Table 2. In Table 2, R [J/(mol·K)] is a gas constant, T [K] is a temperature, and Δt is a micro time.

As the initial conditions, the amounts of the nitrogen gas and nitrogen monoxide gas introduced are input in [N$_2$]t$_n$ and [NO]t$_n$ of the formulae (12) to (20) in the unit of mol/cm$^3$. The elements and molecules other than the nitrogen gas and the nitrogen monoxide, such as [N$_2$O]t$_n$ and [O]t$_n$, are 0 mol/cm$^3$, and concentrations of each element and molecule [N$_2$]t$_{n+1}$, [NO]t$_{n+1}$, [N$_2$O]t$_{n+1}$, [O]t$_{n+1}$, [N]t$_{n+1}$ and [O$_2$]t$_{n+1}$ after the micro time Δt second has passed are obtained.

To prevent numerical divergence during calculation, it is suitable that the time step $\Delta t$ is 1 nanosecond. This calculation is repeated, and the concentration of each element after passing a certain time is derived.

TABLE 2

(1) $k_a = 7.0 \times 10^{11} \times \exp(-272000/RT)$ [1/s]
(2) $k_{-a} = 2.5 \times 10^{13} \times \exp(-112000/RT)$ [1/s]
(3) $k_b = 1.5 \times 10^9 \times T \times \exp(-161000/RT)$ [1/s]
(4) $k_{-b} = 6.4 \times 10^9 \times T \times \exp(-26000/RT)$ [1/s]
(5) $k_c = 3.1 \times 10^{13} \times \exp(-1400/RT)$ [1/s]
(6) $k_{-c} = 1.4 \times 10^{14} \times \exp(-316000/RT)$ [1/s]
(7) $k_d = 1.5 \times 10^{15} \times T^{-0.8} \times \exp(-14000/RT)$ [1/s]
(8) $k_{-d} = 1.4 \times 10^{21} \times T^{-1.8} \times \exp(-493000/RT)$ [1/s]
(9) $k_e = 3.0 \times 10^{12} \times \exp(-198000/RT)$ [1/s]
(10) $k_{-e} = 1.0 \times 10^{13} \times \exp(-2500/RT)$ [1/s]
(11) $k_f = 1.0 \times 10^{15} \times \exp(-117000/RT)$ [1/s]
(12) $[NO]t_{n+1} = [NO]t_n - k_a \times [NO]t_n \times \Delta t + k_{-a} \times [N_2O]t_n \times [O]t_n \times \Delta t - k_b \times [NO]t_n \times [O]t_n \times \Delta t + k_{-b} \times [O_2]t_n \times [N]t_n \times \Delta t - k_c \times [NO]t_n \times [N]t_n \times \Delta t + k_{-c} \times [N_2]t_n \times [O]t_n \times \Delta t - k_d \times [O]t_n \times [O]t_n \times [M]t_n \times \Delta t + k_{-d} \times [O_2]t_n \times [M]t_n \times \Delta t - k_e \times [NO]t_n \times [O_2]t_n \times \Delta t + k_{-e} \times [NO_2]t_n \times [O]t_n \times \Delta t$
(13) $[NO]t_{n+1} = [NO]t_n - k_a \times [NO]t_n \times [NO]t_n \times \Delta t + k_{-a} \times [N_2O]t_n \times [O]t_n \times \Delta t - k_b \times [NO]t_n \times [O]t_n \times \Delta t + k_{-b} \times [O_2]t_n \times [N]t_n \times \Delta t - k_c \times [NO]t_n \times [N]t_n \times \Delta t + k_{-c} \times [N_2]t_n \times [O]t_n \times \Delta t - k_d \times [O]t_n \times [O]t_n \times [M]t_n \times \Delta t + k_{-d} \times [O_2]t_n \times [M]t_n \times \Delta t - k_e \times [NO]t_n \times [O_2]t_n \times \Delta t + k_{-e} \times [NO_2]t_n \times [O]t_n \times \Delta t$
(14) $[O_2]t_{n+1} = [O_2]t_n + k_b \times [NO]t_n \times [O]t_n \times \Delta t - k_{-b} \times [O_2]t_n \times [N]t_n \times \Delta t + k_d \times [O]t_n \times [O]t_n \times [M]t_n \times \Delta t - k_{-d} \times [O_2]t_n \times [M]t_n \times \Delta t + k_f \times [N_2O]t_n \times [O]t_n \times \Delta t$
(15) $[N_2O]t_{n+1} = [N_2O]t_n + k_a \times [NO]t_n \times [NO]t_n \times \Delta t - k_{-a} \times [N_2O]t_n \times [O]t_n \times \Delta t - k_f \times [N_2O]t_n \times [O]t_n \times \Delta t$
(16) $[O]t_{n+1} = [O]t_n + k_a \times [NO]t_n \times [NO]t_n \times \Delta t - k_{-a} \times [N_2O]t_n \times [O]t_n \times \Delta t - k_b \times [NO]t_n \times [O]t_n \times \Delta t + k_{-b} \times [O_2]t_n \times [N]t_n \times \Delta t + k_c \times [NO]t_n \times [N]t_n \times \Delta t - k_{-c} \times [N_2]t_n \times [O]t_n \times \Delta t - k_d \times [O]t_n \times [O]t_n \times [M]t_n \times \Delta t + k_{-d} \times [O_2]t_n \times [M]t_n \times \Delta t + k_e \times [NO]t_n \times [O_2]t_n \times \Delta t - k_{-e} \times [NO_2]t_n \times [O]t_n \times \Delta t - k_f \times [N_2O]t_n \times [O]t_n \times \Delta t$
(17) $[NO_2]t_{n+1} = [NO_2]t_n + k_e \times [NO]t_n \times [O_2]t_n \times \Delta t - k_{-e} \times [NO_2]t_n \times [O]t_n \times \Delta t$
(18) $[N]t_{n+1} = [N]t_n + k_b \times [NO]t_n \times [O]t_n \times \Delta t - k_{-b} \times [O_2]t_n \times [N]t_n \times \Delta t - k_c \times [NO]t_n \times [N]t_n \times \Delta t + k_{-c} \times [N_2]t_n \times [O]t_n \times \Delta t$
(19) $[N_2]t_{n+1} = [N_2]t_n + k_f \times [N_2O]t_n \times [O]t_n \times \Delta t$
(20) $[M]t_{n+1} = [M]t_n$ When the temperature of the nitrogen gas and the nitrogen monoxide gas is a temperature higher than 1,150 degrees C., such as 1,200 degrees C., more preferably about 1,250 degrees C., the nitrogen gas reacts with oxygen or the like as shown in the formula (c) of Table 1. Therefore, compared to when the nitrogen monoxide gas is diluted with an inert gas and the nitriding treatment is conducted, nitrogen can be reacted in larger amount, and the generation of oxygen and the progress of oxidation of a silicon carbide layer due to the generation of oxygen can be inhibited.

In the case of the nitriding treatment in the present embodiment, the nitriding treatment temperature is 1,250 degrees C., the mixing ratio between the nitrogen gas and the nitrogen monoxide gas is 1:1, the flow velocity of the mixed gas of the nitrogen gas and the nitrogen monoxide gas is about 8 mm/second, and the distance L between the substrate 300 and the gas inlet 203 is 200 mm or larger. As a result, the nitrogen gas is sufficiently heated and is easily reacted. Therefore, from the reaction formulae of Table 1, the ratio between the concentration of the oxygen gas generated by the reaction and the concentration of the nitrogen monoxide gas can be 0.05 or smaller, and the nitriding can efficiently be conducted while inhibiting oxidation at the interface.

Figure 10:
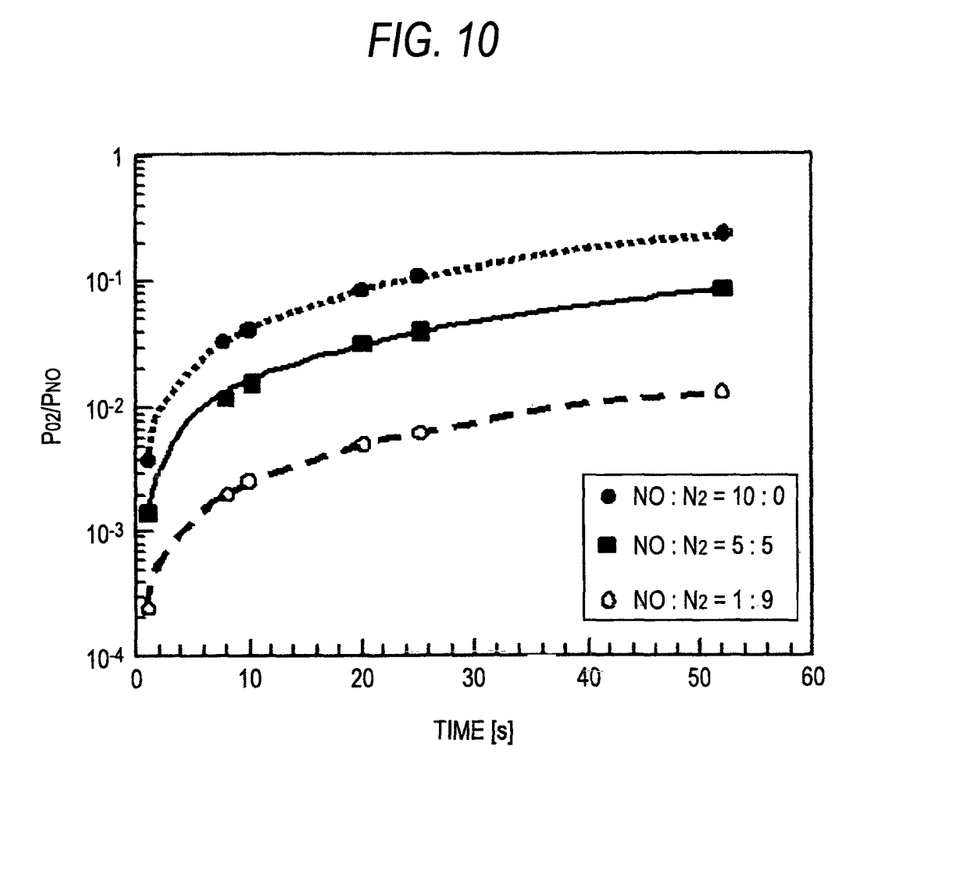
FIG. 10 is a relationship view showing the relationship of a ratio of an oxygen partial pressure to a nitrogen monoxide partial pressure at a substrate position in a furnace to a retention time in a furnace of a mixed gas in a nitridation step of a silicon carbide semiconductor device in the embodiment 1 of this invention.

FIG. 10 shows the results that the ratio of the oxygen partial pressure to the nitrogen monoxide partial pressure at the position near the substrate 300 to the retention time in the furnace 200 of the mixed gas introduced from the position of the gas inlet 203 was obtained hourly and every oxygen in terms of the ratio between the nitrogen monoxide gas and the nitrogen gas in the mixed gas introduced, in the case that the nitriding temperature is 1,250 degrees C. The calculation was conducted according to the formulae in Table 1. In FIG. 10, even in the case of the mixed gas having any mixing ratio, the ratio of the oxygen partial pressure to the nitrogen monoxide partial pressure at the position near the substrate 300 is increased with the increase of the retention time of the mixed gas in the furnace 200. Furthermore, the ratio of the oxygen partial pressure to the nitrogen monoxide partial pressure at the position near the substrate 300 is increased with the increase of the mixing ratio of nitrogen monoxide in the mixed gas introduced in the furnace 200.

To further reduce the interface state between the gate insulating film and the silicon carbide layer, the nitriding should be promoted and the oxidation should be inhibited. However, from the results shown in FIG. 10, to further reduce the interface state, the retention time of the mixed gas in the furnace 200 should further be shortened and the mixing ratio of nitrogen monoxide in the mixed gas introduced should be decreased.

Figure 11:
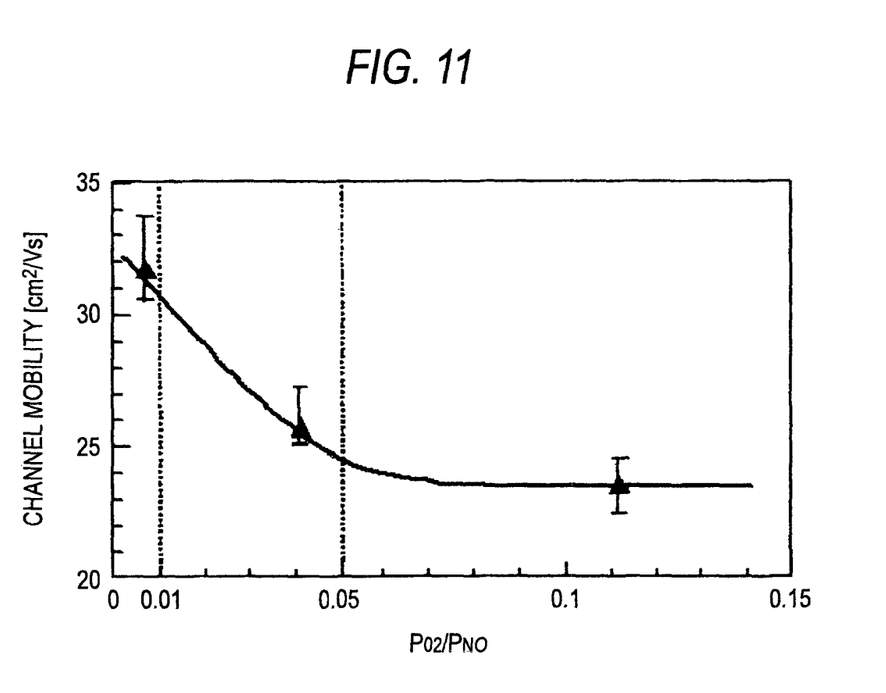
FIG. 11 is a relationship view showing the relationship of a ratio between an oxygen partial pressure to a nitrogen monoxide partial pressure at a substrate position in nitridation and channel mobility of a silicon carbide semiconductor device in the embodiment 1 of this invention.

FIG. 11 shows that the channel mobility of an inversion type n-channel silicon carbide MOSFET,-which is one kind of the silicon carbide semiconductor device in the present embodiment manufactured in each condition calculated in FIG. 10, is shown to the ratio of a an oxygen partial pressure to a nitrogen monoxide partial pressure at a position near the substrate 300. The silicon carbide MOSFET in which its channel mobility is shown in FIG. 11 is-that a gate insulating film thickness is about 50 nm, a flow rate of nitrogen monoxide is adjusted to a range of from 0.15 to 0.75 slm, allow rate of nitrogen is adjusted to a range of from 0.75 to 1.35 slm, and a nitriding time is 1 hour.

As shown in FIG. 11, the channel mobility of the silicon carbide MOSFET is increased as the ratio of the oxygen partial pressure to the nitrogen monoxide partial pressure at the position near the substrate 300 is decreased. The ratio of the oxygen partial pressure to the nitrogen monoxide partial pressure should be preferably 0.05 or smaller.

The present embodiment shows the example that the gate insulating film 50 is a silicon oxide film formed by oxidizing silicon carbide. However, the gate insulating film 50 may be a deposited film formed by a CVD method, a deposition method, a sputtering method, an ion cluster beam method, a molecular beam epitaxy or the like. The material is not limited to silicon oxide, and a silicon nitride film, a silicon oxynitride film, an aluminum oxide film, an aluminum nitride film, a hafnium oxide film, a zirconium oxide film and the like may also be used. The gate insulating film may have, for example, a laminate structure combining silicon nitride and silicon dioxide.

The n-type low resistance silicon carbide substrate 10 having 4H poly type, a plane direction of a first principal surface being (0001) plane, is shown as the silicon carbide substrate 10. However, the silicon carbide substrate 10 is not limited to this, and the plane direction may be (000-1) plane, (11-20) plane or the like. Substrates inclining from those plane directions may also be used. Furthermore, the poly type of the silicon carbide substrate 10 may be 6H or 3C.

Low resistance polycrystal silicon is shown as the material of the gate electrode 60, but the conductive type may be an n-type or a p-type. Furthermore, the material may be an n-type or p-type low resistance polycrystal silicon carbide. The material of the gate electrode 60 may be Al, titanium (Ti), molybdenum (Mo), tantalum (Ta), niobium (Nb), tungsten (W), and their nitrides. The same thing as described above to the material of the gate electrode 60 can be said to the materials of the source electrode 70 and the drain electrode 80. Annealing may be conducted at about 1,000 degrees C. after forming the electrode.

In the present embodiment, the flow velocity of the mixed gas is approximately 8 mm/sec, and the distance L of from the gas inlet 203 of the furnace 200 to the substrate 300 is 200 mm or smaller. However, in the case that the nitriding temperature is 1,250 degrees C. and the mixing ratio between the nitrogen gas and the nitrogen monoxide gas is 1:1, the invention is not limited to those conditions so long as the time that the mixed gas reaches the substrate 300 from the gas inlet 203 of the furnace 200 is 25 seconds or shorter. Further, for example, when the mixing ratio between the nitrogen gas and the nitrogen monoxide gas is 9:1, it is only necessary that the time that the mixed gas reaches the substrate 300 from the gas inlet 203 of the furnace 200 is 50 seconds or shorter and the flow rate of the mixed gas at ordinary temperature is 0.75 slm or larger.

In the present embodiment, the case when the nitriding temperature is 1,250 degrees C. has been described in detail, but the nitriding temperature is not limited to this temperature. Even when the temperature is lower than 1,250 degrees C., the calculation can be performed in the same manner as in the case of 1,250 degrees C., and the flow rate of the nitrogen gas and nitrogen monoxide gas is determined thereby. In the case of treating at any temperature, the ratio of the oxygen partial pressure to the nitrogen monoxide partial pressure at the position of the substrate 300 should be 0.05 or smaller, and more preferably 0.01 or smaller, according to the shape of the furnace 200 and the arrangement position of the substrate 300.

Thus, in the method for manufacturing a silicon carbide semiconductor device in the present embodiment of this invention, the nitriding treatment is conducted using a mixed gas of a nitrogen gas and a nitrogen monoxide gas, each having controlled flow rate and flow velocity, after forming a gate insulating film, an oxygen partial pressure to a nitrogen monoxide partial pressure at a position of the substrate 300 can be decreased to 0.05 or smaller, and preferably 0.01 or smaller, and a ratio of an oxidation reaction to a nitriding reaction can be reduced. As a result, silicon carbide MOSFET having smaller interface state at the interface between a silicon carbide layer and a gate insulating film and having high mobility can be obtained.

Embodiment 2

Figure 12:
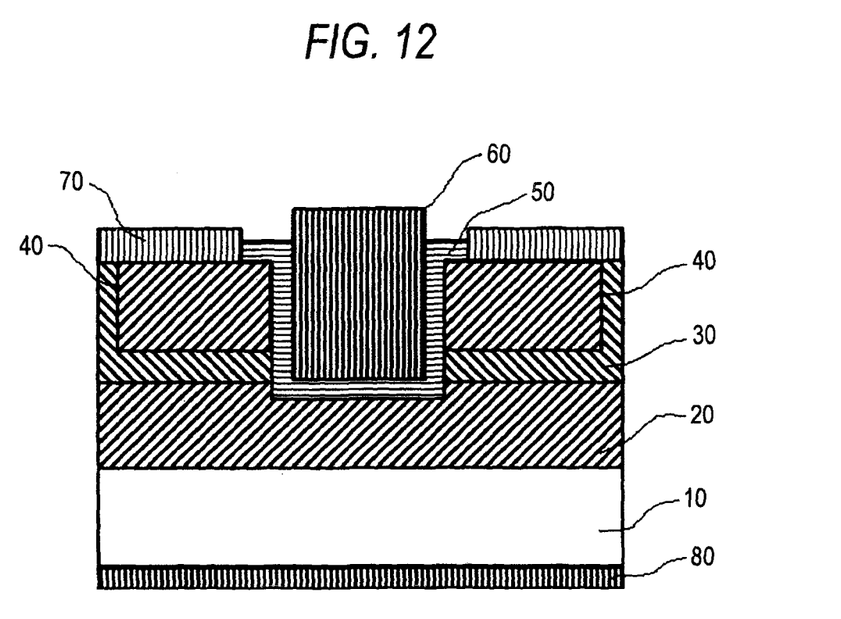
FIG. 12 is a cross-sectional schematic view of a silicon carbide semiconductor device in an embodiment 2 of this invention.

FIG. 12 is a cross-sectional schematic view of silicon carbide MOSFET which is a silicon carbide semiconductor device in an embodiment 2 of this invention. In FIG. 12, an n-type drift layer 20, a p-type base region 30 and an n-type source region 40 are sequentially laminated on a first principal surface of a silicon carbide substrate 10. A trench which penetrates through the base region 30 and the source region 40 and reaches the drift layer 20 is provided in the n-type drift layer 20, the p-type base region 30 and the n-type source region 40, and each of the drift layer 20, the base region 30 and the source region 40 is configured of silicon carbide.

A gate insulating film 50 configured of silicon carbide is formed on the surface of the trench and the surface of the source region 40, except for a part of the surface side of the source region 40. A gate electrode 60 is formed at a position facing the drift layer 20, the base region 30 and the source region 40 on the gate insulating film 50. A source electrode 70 is formed on the surface of the source region 40 on which the gate insulating film 50 is not formed, and a drain electrode 80 is formed on a second principal surface opposite the first principal surface, that is, a rear side, of the silicon carbide substrate 10. The silicon carbide MOSFET of the present embodiment is the same as in the embodiment 1 except that the structure is a trench structure. Therefore, the description of detailed conditions is omitted.

In the silicon carbide MOSFET having a trench structure of the present invention, similar to the case of manufacturing the silicon carbide MOSFET shown in the embodiment 1, when the nitriding treatment is conducted using a mixed gas of a nitrogen gas and a nitrogen monoxide gas after forming the gate insulating film 50, the interface state formed at the interface between the silicon carbide layer and the gate insulating film 50 can be reduced, and field effect mobility of a carrier can be increased.

In silicon carbide IGBT (Insulated Gate Bipolar Transistor), when the nitriding treatment is conducted using a mixed gas of a nitrogen gas and a nitrogen monoxide gas after forming the gate insulating film 50 similar to the present embodiment, the same effect can be exhibited.

In the above-described embodiments 1 and 2, an example of an n-type MOSFET using electrons as a carrier is shown, but a p-type MOSFET in which the carrier is a hole may also be used.

| Description of Reference Numerals and Signs | |
|---|---|
| 10 | Silicon carbide substrate |
| 20 | Drift layer |
| 30 | Base region |
| 40 | Source region |
| 50 | Gate insulating film |
| 60 | Gate electrode |
| 70 | Source electrode |
| 80 | Drain electrode |
| 200 | Furnace |
| 201 | Boat |
| 202 | Heater |
| 203 | Gas inlet |
| 204 | Dummy substrate |
| 300 | Substrate |

The invention claimed is:

1. A method for manufacturing a silicon carbide semiconductor device, comprising:
    (a) introducing a substrate, which comprises a silicon carbide layer and a gate insulating film on, and in contact with, the silicon carbide layer, in a furnace, such that the substrate is arranged in a predetermined position of the furnace; and
    (b) heating the furnace having the substrate introduced therein while introducing nitrogen monoxide and nitrogen into the furnace,
    wherein, in the heating (b), the nitrogen is reacted to nitride an interface between the gate insulating film and the silicon carbide layer, and
    wherein the retention time until the nitrogen monoxide and the nitrogen reach the substrate from a gas inlet of the furnace is 50 seconds or shorter.

2. The method of claim 1,
    wherein the heating (b) comprises controlling at least one flow rate of the nitrogen monoxide and the nitrogen introduced into the furnace, and
    wherein the predetermined position of the furnace where the substrate is arranged so as to shorten a retention time of the nitrogen monoxide and the nitrogen in the furnace, thereby controlling a partial pressure of oxygen generated by a reaction between the nitrogen monoxide and the nitrogen to be 0.05 of a partial pressure of the nitrogen monoxide or lower at a position near the substrate.

3. The method of claim 1, wherein the heating (b) comprises heating the substrate to a temperature between 1,200 degrees C. and 1,300 degrees C.

4. The method of claim 1, wherein the heating (b) comprises substituting a gas to be introduced just after completion of nitriding treatment, in which the nitrogen monoxide and the nitrogen is introduced, with nitrogen.

5. The method of claim 2, wherein the heating b) comprises controlling the partial pressure of the oxygen to be 0.01 of the partial pressure of the nitrogen monoxide or lower at the surface of the substrate.

6. The method of claim 1, wherein the gate insulating film is a silicon dioxide film.

7. The method of claim 1, wherein the retention time until the nitrogen monoxide and the nitrogen reach the substrate from the gas inlet of the furnace is 25 seconds or shorter.

8. The method of claim 1, wherein, when an inner diameter of the furnace is 140 mm, a flow rate of a mixed gas of the nitrogen monoxide and the nitrogen in the furnace is 0.75 slm or larger.

9. The method of claim 1, wherein a flow velocity of a mixed gas of the nitrogen monoxide and the nitrogen in the furnace is approximately 8mm/sec.

10. A method for manufacturing a silicon carbide semiconductor device, comprising:
   (a) introducing a substrate, which comprises a silicon carbide layer and a gate insulating film on, and in contact with, the silicon carbide layer, in a furnace, such that the substrate is arranged in a predetermined position of the furnace; and
   (b) heating the furnace having the substrate introduced therein while introducing nitrogen monoxide and nitrogen into the furnace,
   wherein, in the heating (b), the nitrogen is reacted to nitride an interface between the gate insulating film and the silicon carbide layer, and
   wherein a flow velocity of a mixed gas of the nitrogen monoxide and the nitrogen in the furnace is approximately 8mm/sec.

11. The method of claim 10,
   wherein the heating (b) comprises controlling at least one flow rate of the nitrogen monoxide and the nitrogen introduced into the furnace, and
   wherein the predetermined position of the furnace where the substrate is arranged so as to shorten a retention time of the nitrogen monoxide and the nitrogen in the furnace, thereby controlling a partial pressure of oxygen generated by a reaction between the nitrogen monoxide and the nitrogen to be 0.05 of a partial pressure of the nitrogen monoxide or lower at a position near the substrate.

12. The method of claim 10, wherein the heating (b) comprises heating the substrate to a temperature between 1,200 degrees C. and 1,300 degrees C.

13. The method of claim 10, wherein the heating (b) comprises substituting a gas to be introduced just after completion of nitriding treatment, in which the nitrogen monoxide and the nitrogen is introduced, with nitrogen.

14. The method of claim 11, wherein the heating b) comprises controlling the partial pressure of the oxygen to be 0.01 of the partial pressure of the nitrogen monoxide or lower at the surface of the substrate.

15. The method of claim 10, wherein the gate insulating film is a silicon dioxide film.

16. The method of claim 10, wherein the retention time until the nitrogen monoxide and the nitrogen reach the substrate from a gas inlet of the furnace is 50 seconds or shorter.

17. The method of claim 10, wherein the retention time until the nitrogen monoxide and the nitrogen reach the substrate from the gas inlet of the furnace is 25 seconds or shorter.

18. The method of claim 10, wherein, when an inner diameter of the furnace is 140 mm, a flow rate of a mixed gas of the nitrogen monoxide and the nitrogen in the furnace is 0.75 slm or larger.

* * * * *